United States Patent
Cromer et al.

(10) Patent No.: US 11,076,495 B2
(45) Date of Patent: *Jul. 27, 2021

(54) ELECTRONIC DEVICE WITH HINGE DEFINING AN ASYMMETRICAL SERVICE LOOP FOR A FLEXIBLE DISPLAY AND CORRESPONDING SYSTEMS AND METHODS

(71) Applicant: Motorola Mobility LLC, Chicago, IL (US)

(72) Inventors: Daryl Cromer, Raleigh, NC (US); Scott P DeBates, Crystal Lake, IL (US); Grant Lloyd, Lawrenceville, GA (US); Alberto R Cavallaro, Northbrook, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/859,032

(22) Filed: Apr. 27, 2020

(65) Prior Publication Data
US 2020/0260598 A1    Aug. 13, 2020

Related U.S. Application Data

(63) Continuation of application No. 16/520,174, filed on Jul. 23, 2019, now Pat. No. 10,701,818, which is a
(Continued)

(51) Int. Cl.
*H05K 7/02* (2006.01)
*H05K 7/04* (2006.01)
(Continued)

(52) U.S. Cl.
CPC ............ *H05K 5/0017* (2013.01); *E05D 7/00* (2013.01); *H01L 51/5237* (2013.01);
(Continued)

(58) Field of Classification Search
USPC ....................................................... 361/807
See application file for complete search history.

(56) References Cited

U.S. PATENT DOCUMENTS

| 4,483,394 A | 11/1984 | Peppers et al. |
| 6,377,324 B1 | 4/2002 | Katsura |

(Continued)

FOREIGN PATENT DOCUMENTS

| DE | 102006013424 | 10/2007 |
| EP | 1403460 | 3/2004 |

OTHER PUBLICATIONS

Pemko CFM83 Full-Mortise Continuous Geared Hinge; https://www.qualitydoor.com/pemko-cfm83-continuous-hinge.html; Sited Visited Feb. 2017; Unknown Publication Date but prior to filing of present application.

(Continued)

*Primary Examiner* — Hung S. Bui
(74) *Attorney, Agent, or Firm* — Philip H. Burrus, IV (57) ABSTRACT

An electronic device includes a hinge coupling at least a first device housing to a second device housing. A flexible display is coupled to the first device housing and the second device housing and spans the hinge. The first device housing defines a curvilinear recess forming at least some of the flexible display into an asymmetrical service loop when the first device housing and the second device housing pivot about the hinge from an axially displaced open position to a closed position. Additional hinges and device housings can be added to accommodate flexible displays of varying lengths.

19 Claims, 8 Drawing Sheets

Related U.S. Application Data continuation of application No. 16/016,316, filed on Jun. 22, 2018, now Pat. No. 10,485,115.

(51) Int. Cl.

| | |
|---|---|
| *H05K 5/00* | (2006.01) |
| *E05D 7/00* | (2006.01) |
| *H01L 51/52* | (2006.01) |
| *H05K 5/02* | (2006.01) |
| *E05D 3/12* | (2006.01) |

(52) U.S. Cl.
CPC ............. *H05K 5/0226* (2013.01); *E05D 3/12* (2013.01); *E05Y 2900/606* (2013.01); *H01L 2251/5338* (2013.01)

(56) References Cited

U.S. PATENT DOCUMENTS

| | | | |
|---|---|---|---|
| 6,402,713 | B1 | 6/2002 | Doyle |
| 7,714,801 | B2 | 5/2010 | Kimmel |
| 8,028,555 | B2 | 10/2011 | Lurie |
| 8,773,849 | B2 | 7/2014 | Bohn |
| 8,982,542 | B2 | 3/2015 | Bohn |
| 9,235,239 | B2 | 1/2016 | van Dijk et al. |
| 9,535,465 | B2 | 1/2017 | Bohn |
| 9,600,035 | B2 | 3/2017 | Park et al. |
| 10,054,990 | B1 | 8/2018 | Harmon et al. |
| 10,063,677 | B2 | 8/2018 | Cavallaro et al. |
| 10,104,790 | B2 | 10/2018 | Lee et al. |
| 10,110,717 | B1 | 10/2018 | Liu |
| 10,469,635 | B1 | 11/2019 | Carlson |
| 10,480,225 | B1 | 11/2019 | Hsu et al. |
| 10,485,115 | B1 * | 11/2019 | Cromer ................ G06F 1/1652 |
| 10,491,725 | B1 | 11/2019 | Harmon et al. |
| 10,545,541 | B1 | 1/2020 | Dighde et al. |
| 2004/0226138 | A1 | 11/2004 | Harmon |
| 2012/0002360 | A1 | 1/2012 | Seo |
| 2012/0162866 | A1 | 6/2012 | Bohn |
| 2012/0264489 | A1 | 10/2012 | Choi et al. |
| 2013/0037228 | A1 | 2/2013 | Verschoor et al. |
| 2013/0044410 | A1 * | 2/2013 | Verschoor ............ G06F 1/1652 |
| | | | 361/679.01 |
| 2013/0342094 | A1 | 12/2013 | Walters |
| 2014/0042293 | A1 | 2/2014 | Mok |
| 2014/0287804 | A1 | 9/2014 | Bohn |
| 2015/0261259 | A1 | 9/2015 | Endo et al. |
| 2016/0143162 | A1 | 5/2016 | Van Dijk et al. |
| 2016/0302314 | A1 | 10/2016 | Bae |
| 2017/0115701 | A1 | 4/2017 | Bae et al. |
| 2017/0264723 | A1 | 9/2017 | Mok |
| 2018/0059728 | A1 | 3/2018 | Kim et al. |
| 2018/0066465 | A1 | 3/2018 | Tazbaz |
| 2018/0292860 | A1 | 10/2018 | Siddiqui |

OTHER PUBLICATIONS

"Existing Solutions Provided by Inventor", Solution 1: Clip Type; Solution 2: outward foldable; Unknown publication date but prior to filing of present application.

"Picture of Samsung Concept Phone", Unknown publication date and source; Prior to May 1, 2018.

"Related Art Provided by Inventor", Document with list and pictures of foldable concepts; Viper and Voyager folding screens; Unknown source; Unknown publication date but prior to filing of present application.

"Samsung Galaxy X—Galaxy Fold", YouTube Video; Posted by Stuffbox on Jan. 20, 2018; https://www.youtube.com/watch?v=T-mvKaVsJOE.

Bui, Hung , "NonFinal Office Action", U.S. Appl. No. 16/520,174, filed Jul. 23, 2019; dated Mar. 4, 2020.

Bui, Hung , "Notice of Allowance", U.S. Appl. No. 16/016,316, filed Jun. 22, 2018; dated Aug. 6, 2019.

Bui, Hung S. , "NonFinal OA", U.S. Appl. No. 16/016,316, filed Jun. 22, 2018; dated Apr. 30, 2019.

Diaconescu, Adrian , "Samsung Display crushes all hope of foldable 'Galaxy X' phone release until 2019", Published on Apr. 4, 2017; https://pocketnow.com/samsung-display-foldable-galaxy-x-phone-2019-release-plans.

Divyarashmi, , "Samsung Galaxy X, Samsung's Foldable Display Phone is Coming Soon", Published Oct. 3, 2017; http://techstepper.com/samsungs-foldable-display-phone-is-coming-soon/.

Eich, Martine , "PCT Search Report and Written Opinion", PCT Application No. PCT/US2019/023925; Filed Mar. 25, 2019; dated May 17, 2019.

Huynh, Nam Trung , "NonFinal Office Action", U.S. Appl. No. 16/131,937, filed Sep. 14, 2018; dated Mar. 28, 2019.

Huynh, Nam Trung , "NonFinal Office Action", U.S. Appl. No. 16/749,721, filed Jan. 22, 2020; dated Feb. 20, 2020.

Huynh, Nam Trung , "Non-Final Office Action", U.S. Appl. No. 16/597,517, filed Sep. 23, 2019; dated Oct. 29, 2019.

Huynh, Nam Trung , "Notice of Allowance", U.S. Appl. No. 16/131,937, filed Sep. 14, 2018; dated Sep. 12, 2019.

Huynh, Nam Trung , "Notice of Allowance", U.S. Appl. No. 16/579,517, filed Sep. 23, 2019; dated Feb. 5, 2020.

Thaker, Nidhi , "Notice of Allowance", U.S. Appl. No. 15/610,368, filed May 31, 2017; dated Jun. 5, 2018, Thaker, Nidhi Vivek , "NonFinal OA", U.S. Appl. No. 15/610,368, filed May 31, 2017; dated Jan. 24, 2018.

Miller, William , "NonFinal Office Action", U.S. Appl. No. 16/127,024, filed Sep. 10, 2018; dated Aug. 17, 2020.

Bui, Hung , "Notice of Allowance", U.S. Appl. No. 16/520,174, filed Jul. 23, 2019; dated May 6, 2020.

De Biolley, Luc , "European Search Report", EP 19188076; dated Jan. 20, 2020.

Huynh, Nam T. , "NonFinal OA", U.S. Appl. No. 16/862,274, filed Apr. 23, 2020; dated Jun. 12, 2020.

* cited by examiner

ELECTRONIC DEVICE WITH HINGE DEFINING AN ASYMMETRICAL SERVICE LOOP FOR A FLEXIBLE DISPLAY AND CORRESPONDING SYSTEMS AND METHODS

CROSS REFERENCE TO PRIOR APPLICATIONS

This application is a continuation application claiming priority and benefit under 35 U.S.C. § 120 U.S. Application Ser. No. 16/520,174, filed Jul. 23, 2019, which is a continuation application claiming priority and benefit under 35 U.S.C. § 120 U.S. application Ser. No. 16/016,316, filed Jun. 22, 2018, each of which is incorporated by reference for all purposes.

BACKGROUND

Technical Field

This disclosure relates generally to electronic devices and corresponding methods, and more particularly to hinged electronic devices.

Background Art

Sophisticated mobile electronic communication devices, such as smartphones, tablet computers, and laptop computers, are becoming increasingly popular and are used by billions of people. These owners use mobile communication devices for many different purposes including, but not limited to, voice communications and data communications for text messaging, Internet browsing, commerce such as banking, and social networking.

Traditionally, handheld devices came in different mechanical configurations. A first configuration, known as a "candy bar," is generally rectangular in shape, has a rigid form factor, and has a display that is always visible. By contrast, a "clamshell" device has a mechanical hinge that allows one housing to pivot relative to the other. While there are also "pivot," "slider," and other devices, the candy bar and flip devices tend to be the most popular.

While candy bar devices offer simplicity of use, some consumers prefer a clamshell device. This can be true for a variety of reasons. Clamshell devices, when folded, generally have a smaller form factor than do candy bar devices. They therefore fit more easily in a pocket. Next, clamshell devices provide protection from the display when folded. This is in contrast to candy bar devices where the display is always exposed.

At the same time, market trends indicate that consumers have a general preference for devices with large displays. However, a hinge frequently interrupts the display of most clamshell devices, thereby limiting the size that the display can ultimately achieve. It would be desirable to have an improved electronic device that reconciles these issues by offers a larger display while still being able to fold about a hinge.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially" and "about" are used to refer to dimensions, orientations, or alignments inclusive of manufacturing tolerances. Thus, a "substantially orthogonal" angle with a manufacturing tolerance of plus or minus two degrees would include all angles between 88 and 92, inclusive. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide a hinged electronic device, i.e., a clamshell device, which includes a flexible display. In one embodiment, the electronic device includes only a first device housing and a second device housing. However, in other embodiments, such as those described below with reference to FIG. 7, the electronic device can have three, four, five, or more device housings for a truly long, extendable display.

Beginning with an embodiment having only a first device housing and a second device housing, in one or more embodiments a hinge couples a first device housing and a second device housing such that the first device housing is pivotable about the hinge toward, or away from, the second device housing. The flexible display is inwardly folding and deforms when the first device housing of the electronic device pivots toward the second electronic device housing about the hinge from an open position toward or to a closed position.

In one or more embodiments, one of the first device housing or the second device housing defines a curvilinear recess, while the other of the first device housing or the second device housing is substantially planar. This asymmetry between device housings forms at least some of the flexible display into an asymmetrical service loop when the first device housing and the second device housing pivot about the hinge from an axially displaced open position to a closed position.

The use of an asymmetric service loop when the first device housing and the second device housing pivot about the hinge from an axially displaced open position to a closed position offers numerous advantages. To begin, the use of an asymmetric service loop with a foldable display allows for the overall electronic device to be thinner. This is true due to the fact that the asymmetric service loop allows for better ways to package the electronics within the device. Illustrating by example, as will be described in more detail below, the inclusion of an asymmetric loop means that the two device housings coupled by a hinge do not need to be the same thickness. Additionally, only one device housing requires a curvilinear recess, thereby resulting in an additional thickness reduction. Moreover, the use of a flexible display that folds allows the user to experience a larger display, when the first device housing and the second device housing pivot about the hinge from the closed position to the axially displaced open position, while still maintaining a relatively small form factor when the first device housing and the second device housing pivot about the hinge from the axially displaced open position to the closed position.

In one or more embodiments, the asymmetrical service loop defines a hemi-cardioid contour defining a convex lobe extending to a bifurcated distal cusp when the first device housing and the second device housing pivot about the hinge from the axially displaced open position to the closed position. In one or more embodiments, a first portion of the hemi-cardioid contour disposed to a first side of an axis bisecting the bifurcated distal cusp defines both a convex contour and a concave contour abutting the curvilinear recess. In one or more embodiments, a first radius of the convex contour is less than a second radius of the concave contour. For example, the first radius may be about five millimeters, while the second radius is about three millimeters.

This hemi-cardioid contour defining its convex lobe extending to the bifurcated distal cusp when the first device housing and the second device housing pivot about the hinge from the axially displaced open position to the closed position advantageously allows for an inwardly foldable electronic device that does not increase thickness over a conventional, hinged, electronic device. The inclusion of both the convex contour and the concave contour advantageously allows electronic devices configured in accordance with embodiments of the disclosure to meet minimum bending radius requirements associated with foldable displays without increasing overall device thickness. Moreover, it allows for inwardly foldable devices that encapsulate the flexible display when in the closed position, rather than having externally facing displays when the device is folded. What's more, embodiments of the disclosure allow for a combination of bend angles to meet display requirements or to meet device form factor requirements.

Figure 1:
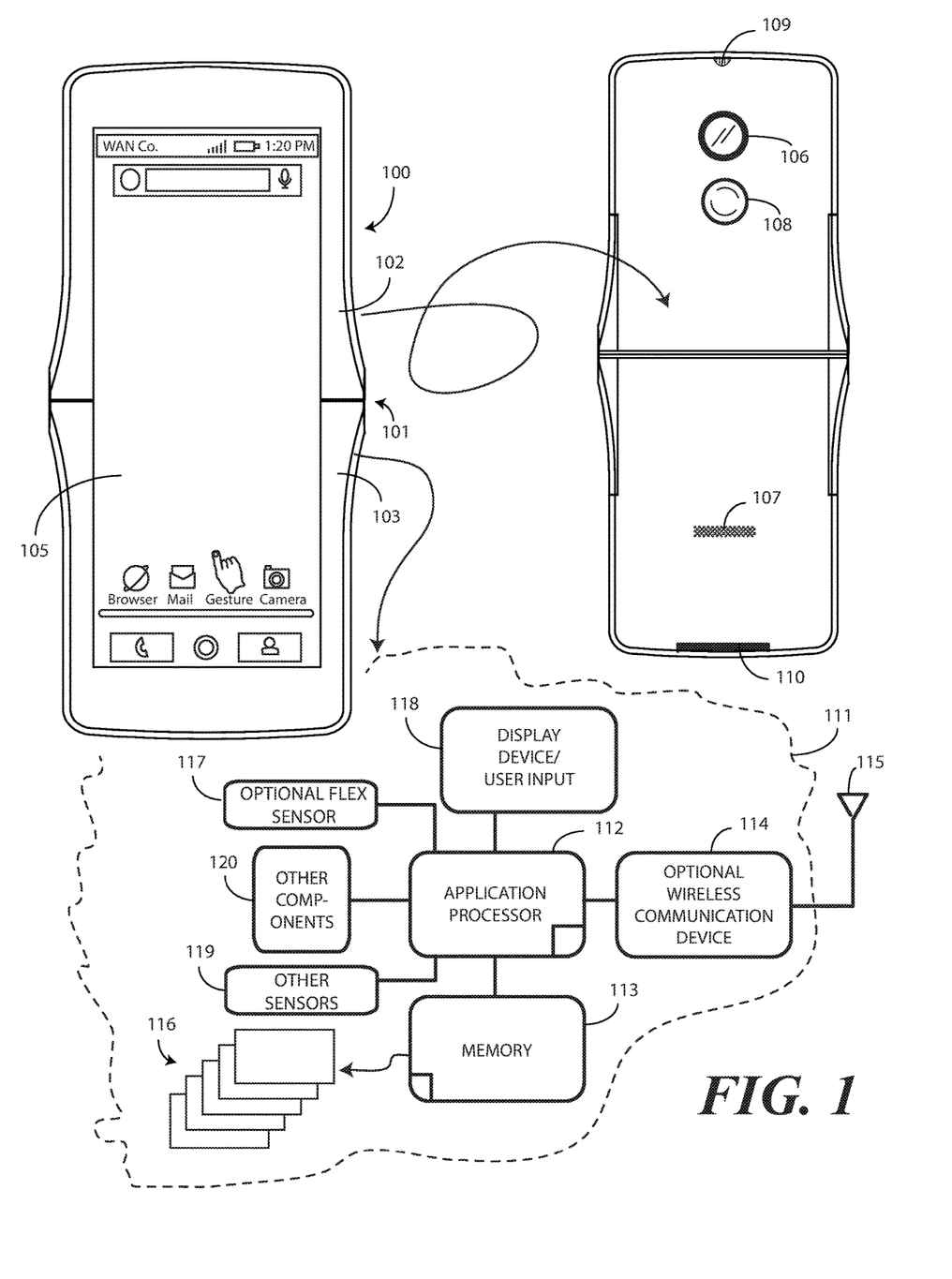
FIG. 1 illustrates one explanatory pivotable electronic device in accordance with one or more embodiments of the disclosure.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other devices as well, including tablet computers, laptop computers, gaming devices, multimedia players, and so forth. Still other types of electronic devices can be configured in accordance with one or more embodiments of the disclosure as will be readily appreciated by those of ordinary skill in the art having the benefit of this disclosure.

The electronic device 100 includes a first device housing 102 and a second device housing 103. In one or more embodiments, a hinge 101 couples the first device housing 102 to the second device housing 103. In one or more embodiments, the first device housing 102 is selectively pivotable about the hinge 101 relative to the second device housing 103. For example, in one or more embodiments the first device housing 102 is selectively pivotable about the hinge 101 between a closed position, shown and described below with reference to FIG. 4, and an open position, shown and described below with reference to FIG. 2.

In one or more embodiments the first device housing 102 and the second device housing 103 are manufactured from a rigid material such as a rigid thermoplastic, metal, or composite material, although other materials can be used. Still other constructs will be obvious to those of ordinary skill in the art having the benefit of this disclosure. In the illustrative embodiment of FIG. 1, the electronic device 100 includes a single hinge. However, in other embodiments, such as those described below with reference to FIG. 7, two or more hinges can be incorporated into the electronic device 100 to allow it to be folded in multiple locations.

This illustrative electronic device 100 of FIG. 1 includes a display 105. The display 105 can optimally be touch-sensitive. In one embodiment where the display 105 is touch-sensitive, the display 105 can serve as a primary user interface of the electronic device 100. Users can deliver user input to the display 105 of such an embodiment by delivering touch input from a finger, stylus, or other objects disposed proximately with the display.

In one embodiment, the display 105 is configured as an organic light emitting diode (OLED) display fabricated on a flexible plastic substrate. This allows the display 105 to be flexible so as to deform when the first device housing 102 pivots about the hinge 101 relative to the second device housing 103. However, it should be noted that other types of displays would be obvious to those of ordinary skill in the art having the benefit of this disclosure. In one or more embodiments, an OLED is constructed on flexible plastic substrates can allow the display 105 to become flexible in one or more embodiments with various bending radii. For example, some embodiments allow bending radii of between thirty and six hundred millimeters to provide a bendable display. Other substrates allow bending radii of around five millimeters to provide a display that is foldable through active bending. Other displays can be configured to accommodate both bends and folds. In one or more embodiments the display 105 may be formed from multiple layers of flexible material such as flexible sheets of polymer or other materials.

In this illustrative embodiment, the display 105 is coupled to the first device housing 102 and the second device housing 103. Accordingly, the display 105 spans the hinge 101 in this embodiment. In one or more embodiments the display 105 is actually coupled to one, or two, slidable trays that situate within one or both of the first device housing 102 and the second device housing 103. The use of one or two slidable trays advantageously allows the display 105 to be placed in tension when the electronic device 100 is in the open position. This causes the display 105 to be flat, rather than wavy due to mechanical memory effects, when the electronic device 100 is in the open position.

Features can be incorporated into the first device housing 102 and/or the second device housing 103. Examples of such features include an optional camera 106 or an optional speaker port 107, which are shown disposed on the rear side of the electronic device 100 in this embodiment, but could be placed on the front side as well. In this illustrative embodiment, a user interface component 108, which may be a button or touch sensitive surface, can also be disposed along the rear side of the first device housing 102. As noted, any of these features are shown being disposed on the rear side of the electronic device 100 in this embodiment, but could be located elsewhere, such as on the front side in other embodiments.

In one embodiment, the electronic device 100 includes one or more connectors 109,110, which can include an analog connector, a digital connector, or combinations thereof. In this illustrative embodiment, connector 109 is an analog connector disposed on a first end, i.e., the top end as viewed in FIG. 1, of the electronic device 100, while connector 110 is a digital/power connector disposed on a second end opposite the first end, which is the bottom end as viewed in FIG. 1.

A schematic block diagram 111 of the electronic device 100 is also shown in FIG. 1. In one embodiment, the electronic device 100 includes one or more processors 112. In one embodiment, the one or more processors 112 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. A storage device, such as memory 113, can optionally store the executable software code used by the one or more processors 112 during operation.

In this illustrative embodiment, the electronic device 100 also includes a communication circuit 114 that can be configured for wired or wireless communication with one or more other devices or networks. The networks can include a wide area network, a local area network, and/or personal area network. Examples of wide area networks include GSM, CDMA, W-CDMA, CDMA-2000, iDEN, TDMA, 2.5 Generation 3GPP GSM networks, 3rd Generation 3GPP WCDMA networks, 3GPP Long Term Evolution (LTE) networks, and 3GPP2 CDMA communication networks, UMTS networks, E-UTRA networks, GPRS networks, iDEN networks, and other networks.

The communication circuit 114 may also utilize wireless technology for communication, such as, but are not limited to, peer-to-peer or ad hoc communications such as HomeRF, Bluetooth and IEEE 802.11 (a, b, g or n), and other forms of wireless communication such as infrared technology. The communication circuit 114 can include wireless communication circuitry, one of a receiver, a transmitter, or transceiver, and one or more antennas 115.

In one embodiment, the one or more processors 112 can be responsible for performing the primary functions of the electronic device 100. For example, in one embodiment the one or more processors 112 comprise one or more circuits operable with one or more user interface devices, which can include the display 105, to present, images, video, or other presentation information to a user. The executable software code used by the one or more processors 112 can be configured as one or more modules 116 that are operable with the one or more processors 112. Such modules 116 can store instructions, control algorithms, logic steps, and so forth.

In one embodiment, the one or more processors 112 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100. The application layer can be responsible for executing application service modules. The application service modules may support one or more applications or "apps." The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

Figure 5:
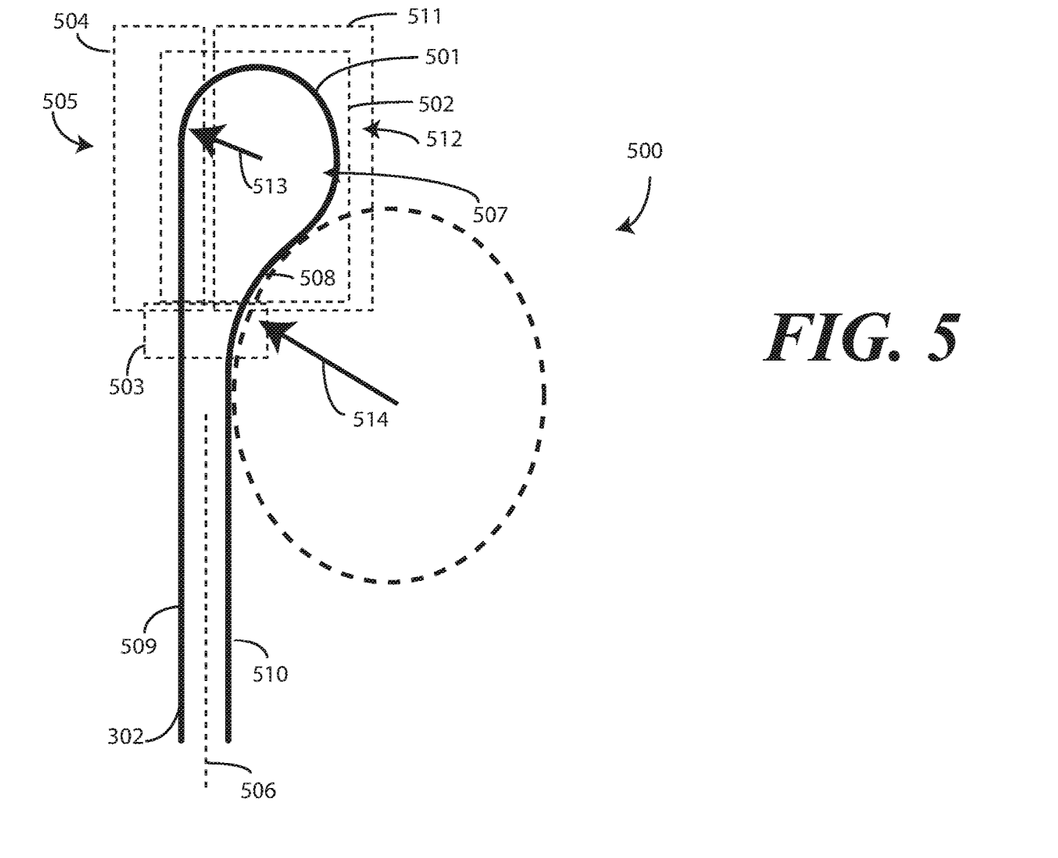
FIG. 5 illustrates a flexible display defining an asymmetrical service loop in accordance with one or more embodiments of the disclosure.

In one embodiment, the electronic device 100 includes one or more flex sensors 117, operable with the one or more processors 112, to detect a bending operation that causes the first device housing 102 to pivot about the hinge 101 relative to the second device housing 103, thereby transforming the electronic device 100 into a deformed geometry, such as that shown in FIG. 5. The inclusion of flex sensors 117 is optional, and in some embodiment flex sensors 117 will not be included.

In one embodiment, the flex sensors 117 comprise passive resistive devices manufactured from a material with an impedance that changes when the material is bent, deformed, or flexed. By detecting changes in the impedance as a function of resistance, the one or more processors 112 can use the one or more flex sensors 117 to detect bending of the first device housing 102 about the hinge 101 relative to the second device housing 103. In one or more embodiments, each flex sensor 117 comprises a bi-directional flex sensor that can detect flexing or bending in two directions. In one embodiment, the one or more flex sensors 117 have an impedance that increases in an amount that is proportional with the amount it is deformed or bent.

In one embodiment, each flex sensor 117 is manufactured from a series of layers combined together in a stacked structure. In one embodiment, at least one layer is conductive, and is manufactured from a metal foil such as copper. A resistive material provides another layer. These layers can be adhesively coupled together in one or more embodiments. The resistive material can be manufactured from a variety of partially conductive materials, including paperbased materials, plastic-based materials, metallic materials, and textile-based materials. In one embodiment, a thermoplastic such as polyethylene can be impregnated with carbon or metal so as to be partially conductive, while at the same time being flexible.

In one embodiment, the resistive layer is sandwiched between two conductive layers. Electrical current flows into one conductive layer, through the resistive layer, and out of the other conductive layer. As the flex sensor 117 bends, the impedance of the resistive layer changes, thereby altering the flow of current for a given voltage. The one or more processors 112 can detect this change to determine an amount of bending. Taps can be added along each flex sensor 117 to determine other information, including the amount of bending, the direction of bending, and so forth. The flex sensor 117 can further be driven by time-varying signals to increase the amount of information obtained from the flex sensor 117 as well. While a multi-layered device as a flex sensor 117 is one configuration suitable for detecting at least a bending operation occurring to deform the electronic device 100 and a geometry of the electronic device 100 after the bending operation, others can be used as well. Other types of flex sensors 117 will be obvious to those of ordinary skill in the art having the benefit of this disclosure.

In one embodiment, the one or more processors 112 may generate commands or execute control operations based on information received from the various sensors, including the one or more flex sensors 117, the user interface 118, or the other sensors 119. The one or more processors 112 may also generate commands or execute control operations based upon information received from a combination of the one or more flex sensors 117, the user interface 118, or the other sensors 119. Alternatively, the one or more processors 112 can generate commands or execute control operations based upon information received from the one or more flex sensors 117 or the user interface 118 alone. Moreover, the one or more processors 112 may process the received information alone or in combination with other data, such as the information stored in the memory 113.

The one or more other sensors 119 may include a microphone, an earpiece speaker, a second loudspeaker (disposed beneath speaker port 107), and a user interface component such as a button or touch-sensitive surface. The one or more other sensors 119 may also include key selection sensors, proximity sensors, a touch pad sensor, a touch screen sensor, a capacitive touch sensor, and one or more switches. Touch sensors may used to indicate whether any of the user actuation targets present on the display 105 are being actuated. Alternatively, touch sensors disposed in the electronic device 100 can be used to determine whether the electronic device 100 is being touched at side edges or major faces of the first device housing 102 or the second device housing 103. The touch sensors can include surface and/or housing capacitive sensors in one embodiment. The other sensors 119 can also include audio sensors and video sensors (such as a camera).

The other sensors 119 can also include motion detectors, such as one or more accelerometers or gyroscopes. For example, an accelerometer may be embedded in the electronic circuitry of the electronic device 100 to show vertical orientation, constant tilt and/or whether the electronic device 100 is stationary. The measurement of tilt relative to gravity is referred to as "static acceleration," while the measurement of motion and/or vibration is referred to as "dynamic acceleration." A gyroscope can be used in a similar fashion.

Other components 120 operable with the one or more processors 112 can include output components such as video outputs, audio outputs, and/or mechanical outputs. Examples of output components include audio outputs such as speaker port 107, earpiece speaker, or other alarms and/or buzzers and/or a mechanical output component such as vibrating or motion-based mechanisms. Still other components will be obvious to those of ordinary skill in the art having the benefit of this disclosure.

It is to be understood that FIG. 1 is provided for illustrative purposes only and for illustrating components of one electronic device 100 in accordance with embodiments of the disclosure, and is not intended to be a complete schematic diagram of the various components required for an electronic device. Therefore, other electronic devices in accordance with embodiments of the disclosure may include various other components not shown in FIG. 1, or may include a combination of two or more components or a division of a particular component into two or more separate components, and still be within the scope of the present disclosure.

Figure 2:
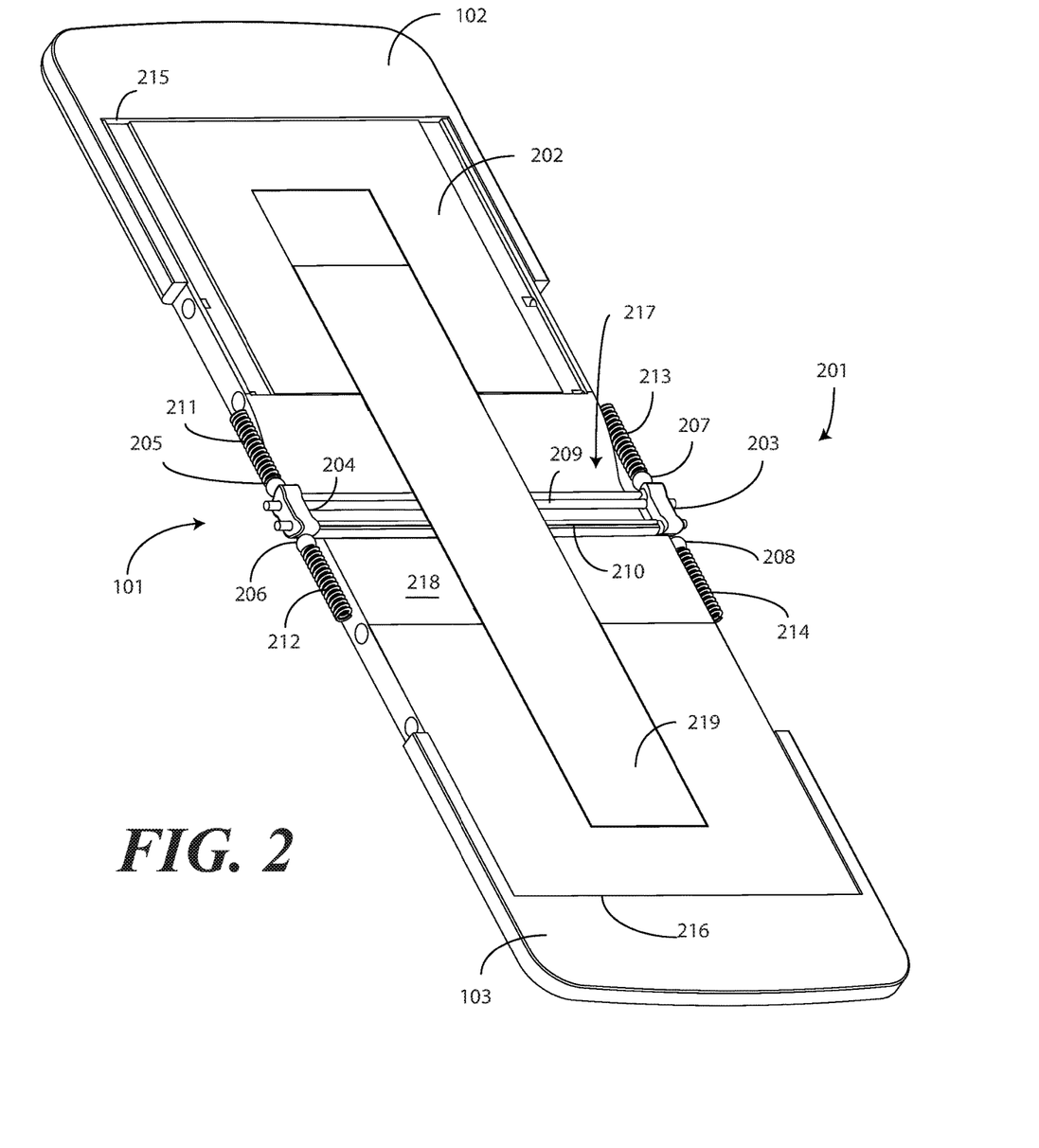
FIG. 2 illustrates a partially cut away view of one explanatory electronic device in an open state where a first device housing is pivoted about a hinge away from a second device housing to an open position in accordance with one or more embodiments of the disclosure.

Turning now to FIG. 2, illustrated therein is a partially cutaway view of the first device housing 102 and the second device housing 103 in an open position 201. In the open position 201, the first device housing 102 is rotated about the hinge 101 to be 180-degrees out of phase with the second device housing 103 such that the first device housing 102 and the second device housing 103 effectively define a plane. When this occurs, the flexible display (105), which is not shown in FIG. 2, flattens into an elongated into a flat position. In one or more embodiments this occurs due to the action of one or more slidable trays 202 disposed within one or both of the first device housing 102 and the second device housing 103.

The hinge 101 in this illustrative embodiment can be configured as described in commonly assigned U.S. application Ser. No. 15/610,368, filed May 31, 2017, entitled, "Electronic Device with Hinge and Corresponding Systems and Methods," which is incorporated herein by reference for all purposes. In one or more embodiments, the hinge 101 includes a first cam 203 and a second cam 204. A first toothed wheel and a second toothed wheel can be positioned adjacent to one or both of the first cam 203 and the second cam 204 to create a symmetric angular rotation of the first device housing 102 and the second device housing 103 when the first device housing 102 pivots about the hinge 101 relative to the second device housing 103. In this illustrative embodiment, the display (105) situates between the first cam 203 and the second cam 204.

Housing members (not shown in FIG. 2, but shown covering the first cam 203 and the second cam 204 in FIG. 4) can couple to the first device housing 102 and the second device housing 103. These housing members can perform two functions. First, they can provide an axis for a first pivot and a second pivot of the hinge 101. Second, they can provide housings for followers 205,206,207,208 to bias against the first cam 203 and the second cam 204.

In one or more embodiments, the housing members are separate from the first device housing 102 and the second device housing 103, but are coupled fixedly thereto by fasteners. In other embodiments, the housing members can be integrated into the first device housing 102 and the second device housing 103. In either embodiment, the housing members effectively become sides and contours of the first device housing 102 and the second device housing 103. Accordingly, as used herein the housing members can alternatively be referred to as components of, extensions of, or portions of the first device housing 102 and the second device housing 103, respectively.

In FIG. 2, the housing members have been removed so that action of the followers 205,206,207,208 biased against the first cam 203 and the second cam 204 can more readily be seen. In one or more embodiments, a corresponding follower and spring is disposed within each of the housing members. Accordingly, in one or more embodiments where two cams, i.e., the first cam 203 and the second cam 204, are included, the hinge 101 will include four followers and four springs. Where only one cam is used, two followers and two springs will be used. Other configurations will be obvious to those of ordinary skill in the art having the benefit of this disclosure.

The springs 211,212,213,214 bias the followers 205,206,207,208 against the first cam 203 and the second cam 204. The followers 205,206,207,208 move about the first cam 203 and the second cam 204 when the first device housing and the second device housing pivot about the hinge from the axially displaced open position 201 to a closed position, and vice versa. The springs 211,212,213,214 bias the first device housing 102 away from the second device housing 103 when the first device housing 102 and the second device housing 103 pivot about the hinge 101 to the axially displaced open position 201 from the closed position of FIG. 4.

In one or more embodiments, the first device housing 102 and the second device housing 103 each define linear recesses 215,216 into which the flexible display may be positioned. Near the hinge 101, one of the first device housing 102 or the second device housing 103 defines a curvilinear recess 217, while the other linear recess surface 218 is substantially planar. In this illustrative embodiment, the curvilinear recess 217 defines a boundary portion of the linear recess 215 in the first device housing 102. The inclusion of the curvilinear recess 217 provides the flexible display room to form a service loop when the first device housing 102 and the second device housing 103 pivot about the hinge 101 to the closed position.

In one or more embodiments, only one of the first device housing 102 or the second device housing 103 defines a curvilinear recess 217. In this illustrative embodiment, the first device housing 102 defines the curvilinear recess 217, while the linear recess surface 218 in the second device housing 103 is substantially planar. Said differently, another housing of the first device housing 102 or the second device housing 103, which is the second device housing 103 in this example, defines a linear recess, i.e., linear recess surface 218) into which the flexible display can be positioned. This asymmetry between linear recess surfaces causes the curvilinear recess 217 of the first device housing 102 to form at least some of the flexible display into an asymmetrical service loop when the first device housing 102 and the second device housing 103 housing pivot about the hinge from the axially displaced open position 201 of FIG. 2 to the closed position of FIG. 4.

Where electrical components, e.g., processors, memories, communication circuits, and other component described in the schematic block diagram (111) of FIG. 1 are positioned in each of the first device housing 102 and the second device housing 103, a flexible conductor 219 can be included between the hinge 101 and the display. The flexible conductor 219, which can bend as the first device housing 102 and the second device housing 103 pivot about the hinge 101 to the closed position, allows electrical signals to pass back and forth between the first device housing 102 and the second device housing 103. In some embodiments, the flexible conductor 219 can provide mechanical support for the flexible display when the first device housing 102 and the second device housing 103 pivot about the hinge 101 to the closed position as well.

In one or more embodiments, the springs 211,212,213, 214, the followers 205,206,207,208, and the first cam 203 and the second cam 204 can all be manufactured from electrically conductive materials. When this occurs, the springs 211,212,213,214, the followers 205,206,207,208, and the first cam 203 and the second cam 204 can define an electrically conductive pathway between the first device housing 102 and the second device housing 103. This electrically conductive pathway can be used in conjunction with the flexible conductor 219. For instance, the flexible conductor 219 may include traces and conduits that transfer power, digital signals, and analog signals between electrical components disposed in the first device housing 102 and the second device housing 103, while the electrically conductive pathway defined by the springs 211,212,213,214, the followers 205,206,207,208, and the first cam 203 and the second cam 204 can provide a return path and/or define a common node for the electronic device. Other electrical configurations will be obvious to those of ordinary skill in the art having the benefit of this disclosure.

Figure 3:
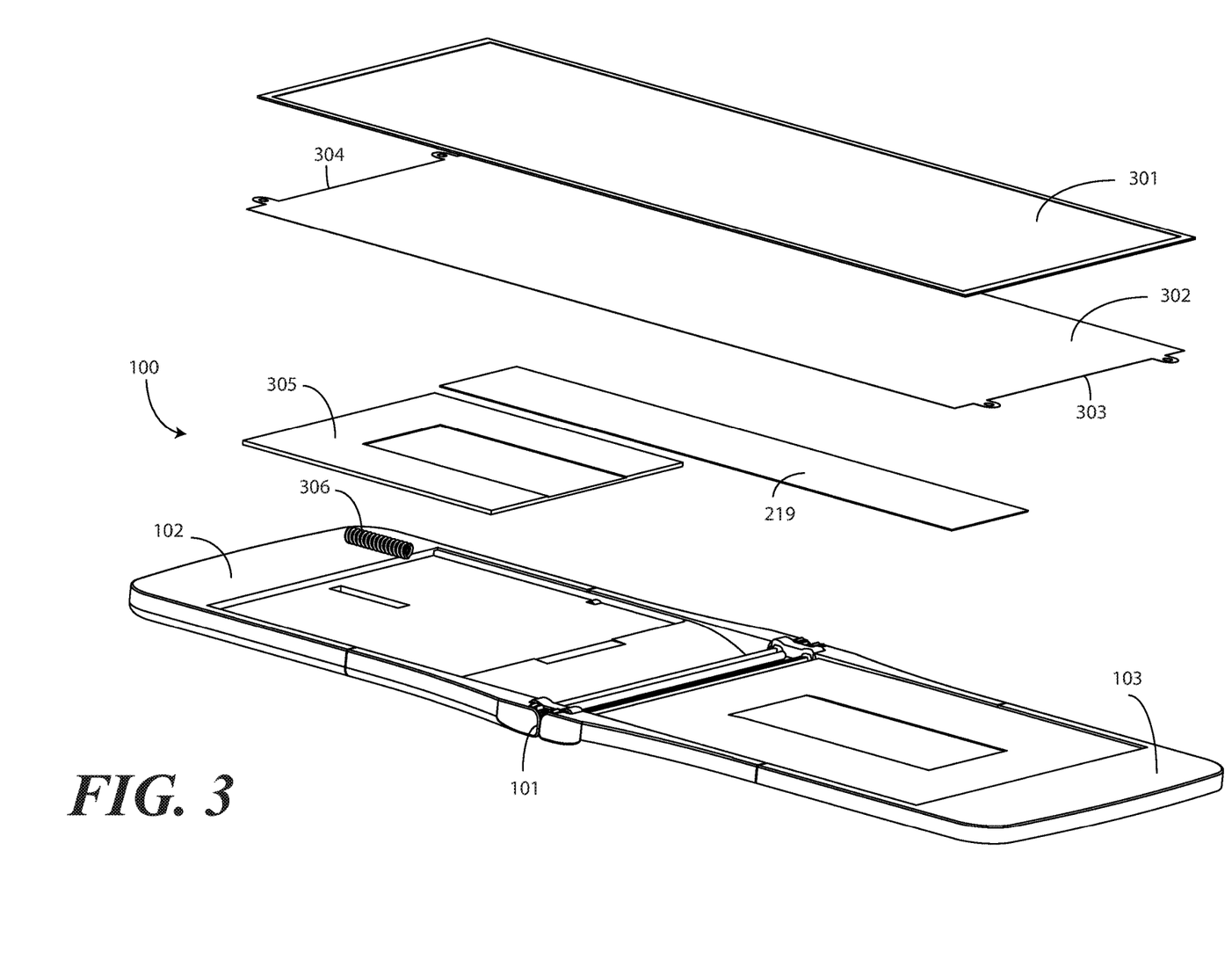
FIG. 3 illustrates an exploded view of one explanatory electronic device in accordance with one or more embodiments of the disclosure.

Turning now to FIG. 3, illustrated therein is an exploded view of one explanatory electronic device 100 configured in accordance with embodiments of the disclosure. As before, the electronic device 100 includes a first device housing 102 and a second device housing 103. A hinge 101 couples the first device housing 102 to the second device housing 103. The first device housing 102 is pivotable about the hinge 101 relative to the second device housing 103 as previously described.

A flexible display 302, shown disposed beneath a flexible fascia 301, can be coupled to the first device housing 102 and the second device housing 103 so as to span the hinge 101. This means that the flexible display 302 deforms when the first device housing 102 pivots about the hinge 101 relative to the second device housing 103.

In this illustrative embodiment, a first end 303 of the flexible display 302 is coupled to the second device housing 103. The second end 304 of the flexible display 302 is coupled to a tray 305. The tray 305 is slidably coupled to the first device housing 102, and is biased away from the hinge 101 by at least a third spring 306.

It should be noted that while only one tray 305 is shown in FIG. 3, the second device housing 103 could likewise include a tray that is slidably coupled to the second device housing 103, and is biased away from the hinge 101 by at least a fourth spring. In such an embodiment, rather than being coupled to the second device housing 103, the first end 303 of the flexible display 302 could be coupled to the second tray.

In either embodiment, the springs bias the trays away from the hinge 101 to flatten the flexible display 302 when the first device housing 102 pivots about the hinge 101 away from the second device housing 103 to the open position (201). In this illustrative embodiment, the flexible conductor 219 is disposed beneath the flexible display 302 and has a first end coupled to the second device housing 103, while a second end is coupled to the tray 305.

Figure 4:
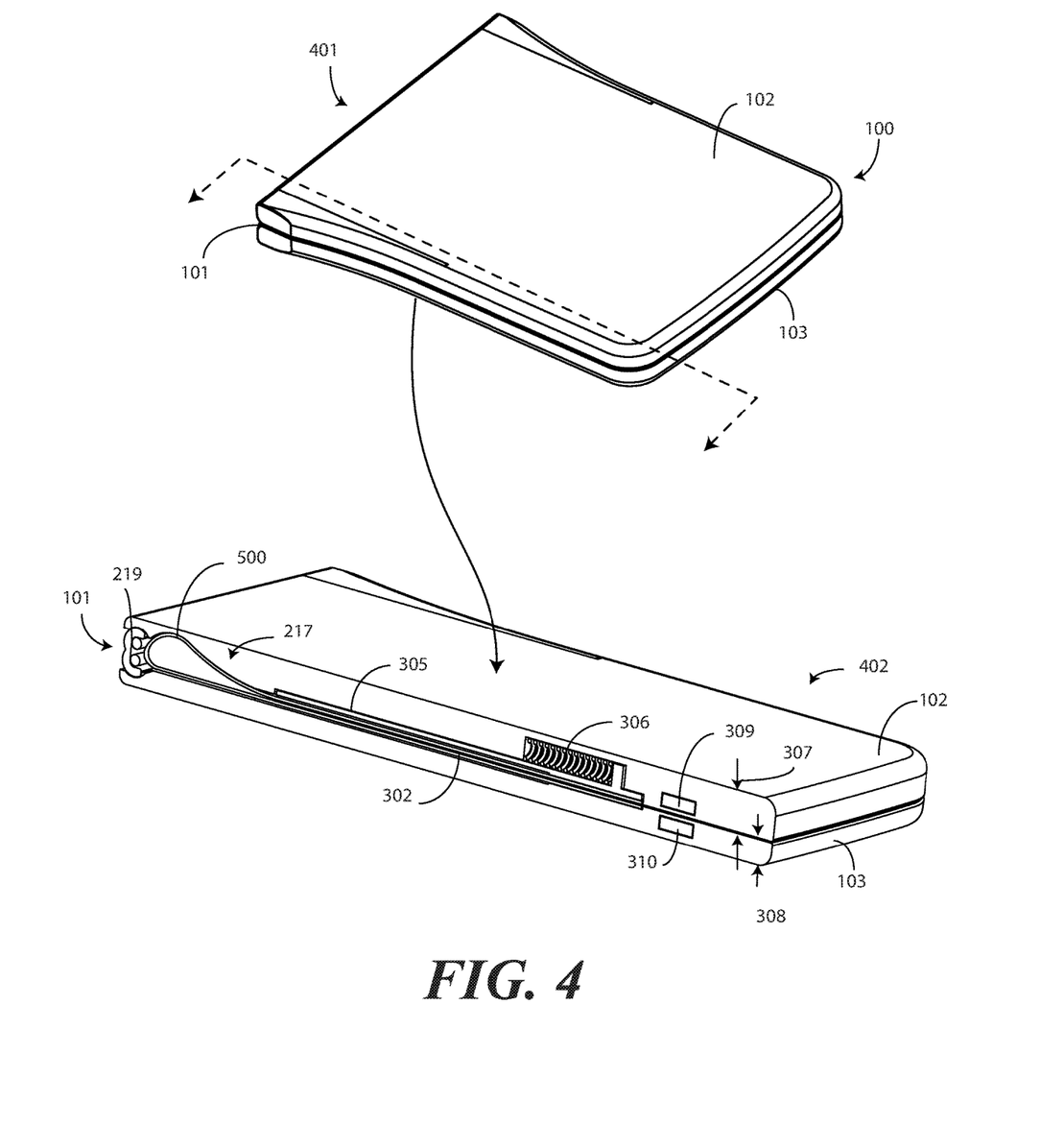
FIG. 4 illustrates perspective and sectional views of one explanatory electronic device in a closed state where the first device housing is pivoted about the hinge toward the second device housing to a closed position in accordance with one or more embodiments of the disclosure.

Turning now to FIG. 4, illustrated therein is the electronic device 100 in a closed state. In this state, the first device housing 102 has been pivoted about the hinge 101 toward the second device housing 103 to a closed position 401. When in the closed position 401, an interior surface of the first device housing 102 abuts an interior surface of the second device housing 103. Effectively, the first device housing 102 and the second device housing 103 are analogous to clam shells that have been shut by the claim, thereby giving rise to the "clamshell" style of device.

FIG. 4 also shows a sectional view 402 of the electronic device 100 in the closed position 401. In the sectional view 402 it can be seen that the third spring 306 biases the tray 305 away from the hinge 101, and thus the second device housing 103 to straighten the flexible display 302 when the first device housing 102 is pivoted about the hinge 101 away from the second device housing 103 to the open position (201).

Also visible in the sectional view 402 of FIG. 4 is the curvilinear recess 217 that gives the flexible display 302 room to form a service loop when the first device housing 102 and the second device housing 103 pivot about the hinge 101 to the closed position 401. Turning briefly to FIG. 5, this service loop 500 is shown.

This service loop 500 occurs due to the fact that the flexible display 302 deforms when the first device housing (102) pivots about the hinge (101) relative to the second device housing (103). The service loop 500 then becomes planar, as shown in FIG. 1, when the first device housing (102) and the second device housing (103) pivot about the hinge (101) to the axially displaced open position (201) from the closed position (401).

The curvilinear recess (217) of the first device housing (102) causes, when the first device housing (102) and the second device housing (103) pivot about the hinge (101) from the axially displaced open position (201) to the closed position (401), the flexible display to define the service loop 500. In this illustrative embodiment, the service loop 500 is asymmetrical. This asymmetry is due to the fact that the service loop 500 defines a hemi-cardioid contour 501. In this illustrative embodiment, the hemi-cardioid contour 501 defines a convex lobe 502 extending to a bifurcated distal cusp 503.

As used herein, a "cardioid" is a heart-shaped curve traced by a point on the circumference of a circle as it rolls around another identical circle. The service loop 500 of FIG. 5 comprises a hemi-cardioid contour 501 due to the fact that a first portion 504 of the hemi-cardioid contour 501, which is disposed to a first side 505 of an axis 506 bisecting the bifurcated distal cusp 503 is substantially flat, while a second portion 511 of the hemi-cardioid contour 501, disposed to a second side 512 of the axis 506 bisecting the bifurcated distal cusp 503 defines both a convex contour 507 and a concave contour 508. In this illustrative embodiment, the first portion 504 of the hemi-cardioid contour 501 disposed to the first side 505 of the axis 506 bisecting the bifurcated distal cusp 503 defines a linear portion extending distally from the convex lobe 502.

When the first device housing (102) and the second device housing (103) pivot about the hinge (101) from the axially displaced open position (201) to the closed position (401), convex contour 507 and the concave contour 508 abut the curvilinear recess (217). The convex contour 507 is denoted "convex" because it is convex relative to the surface of the curvilinear recess (217). Similarly, the concave contour 508 is denoted "concave" because it is concave relative to the surface of the curvilinear recess (217).

The bifurcated distal cusp 503 is "bifurcated" due to the fact that a first portion 509 of the flexible display 302 disposed to the first side 505 of the axis 506 bisecting the bifurcated distal cusp 503 is separated from a second portion 510 of the flexible display 302 disposed to a second side 512 of the axis 506 bisecting the bifurcated distal cusp 503. Thus, while a geometric hemi-cardioid contour may include an intersecting cusp defining a point, in this illustrative embodiment the convex lobe 502 of the hemi-cardioid contour 501 extends to a bifurcated distal cusp 503.

In one or more embodiments, the length of a first radius 513 of the convex contour 507 is less than the length of a second radius 514 of the concave contour 508. Illustrating by example, in one embodiment, the length of a first radius 513 of the convex contour 507, and therefore the radius of the convex lobe 502, is between two and six millimeters, inclusive, while the length of a second radius 514 of the concave contour 508 is greater than this, such as between six and ten millimeters, inclusive. In one or more embodiments, the length of a first radius 513 of the convex contour 507 is about five millimeters. In one or more embodiments, the length of a first radius 513 of the convex contour 507 is about three millimeters.

Turning now back to FIG. 4, the fact that the service loop 500 is asymmetrical, due to the fact that a first portion of the service loop defines a convex lobe while a second portion of the service loop 500 defines a linear portion extending distally from the concave lobe, allows the first device housing 102 and the second device housing 103 to have different thicknesses. In this example, since the first device housing 102 accommodates the convex lobe, it is thicker than the second device housing 103. Said differently, in this embodiment the first device housing 102 has a cross-sectional thickness 307 that is thicker than another cross-sectional thickness 308 of the second device housing 103. In one or more embodiments, the cross-sectional thickness 307 of the first device housing 102 is about six millimeters, while the cross-sectional thickness 308 of the second device housing 103 is between three and six millimeters.

When the first device housing 102 and the second device housing 103 pivot about the hinge 101 to the closed position 401, the curvilinear recess 217 translates radially about the first pivot 209 to become exposed to, and to receive, the service loop 500 of the flexible display 302. This area for the service loop 500 prevents the flexible display 302 from kinking or folding. At the same time, it allows for the overall electronic device to be thinner.

Where, for example, the flexible display 302 has a minimum bending radius of about five millimeters, if a symmetrical service loop were used, e.g., one defining a U-shape, the symmetry would the overall thickness the device, as ten millimeters of space would required between the folds. By using an asymmetrical bend, embodiments of the disclosure can decrease the overall thickness of by at least twenty percent. The service loop 500 advantageously allows for an inwardly foldable electronic device that does not increase thickness over a conventional, hinged, electronic device. The inclusion of both the convex contour and the concave contour advantageously allows for inwardly foldable devices that encapsulate the flexible display 302 when in the closed position (401), rather than having externally facing displays when the device is folded. It also works to minimize mechanical memory problems when the first device housing 102 and the second device housing 103 pivot about the hinge 101 to the open position (201).

In one or more embodiments, magnets 309,310 can be incorporated into the interior surfaces of the first device housing 102 and the second device housing 103. For instance, magnets 309,310 can be placed in the first device housing 102 and the second device housing 103 to retain the first device housing 102 and the second device housing 103 in the closed position 401. When in the closed position 401, the tray 305 slides toward the hinge 101, thereby compressing the third spring 306.

Figure 6:
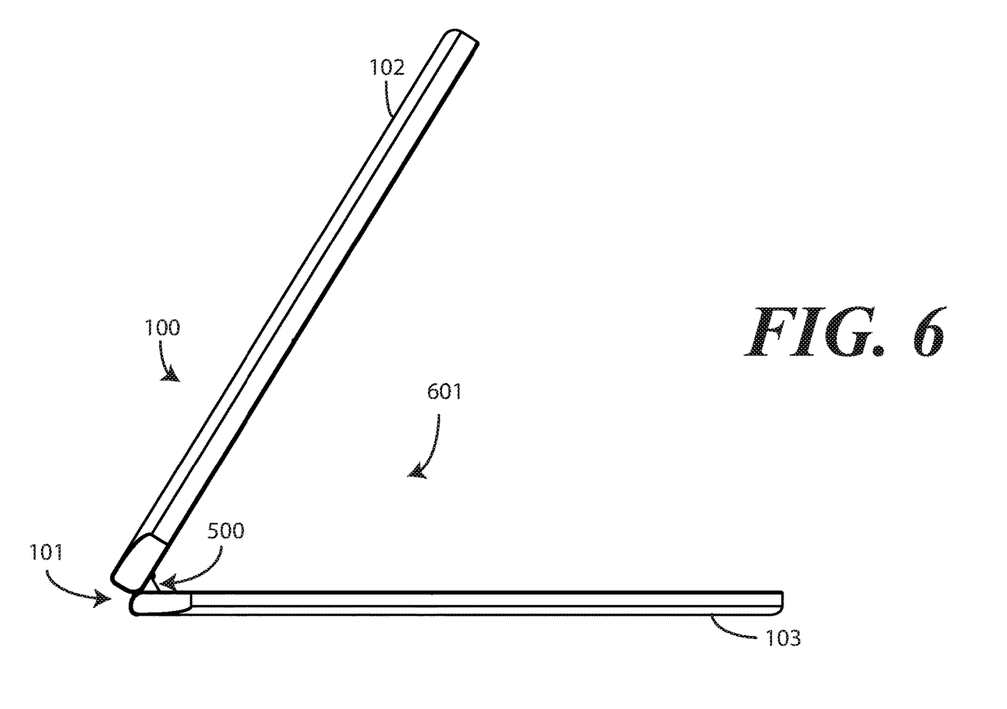
FIG. 6 illustrates one explanatory electronic device in a partially open state where the first device housing is partially pivoted about the hinge away from the second device housing toward, but not fully to, an open position in accordance with one or more embodiments of the disclosure.

Turning now to FIG. 6, illustrated therein is the electronic device 100 being transitioned between the closed position (401) of FIG. 4 and the axially displaced open position (201) of FIG. 2. When the first device housing 102 is pivoting about the hinge 101 away from the second device housing 103 toward an open position, the service loop 500 extends and expands, ultimately becoming planar when the first device housing 102 and the second device housing 103 pivot about the hinge 101 to the axially displaced open position (201) from the closed position (401). The position shown in FIG. 6 is a "tent position" 601.

Figure 7:
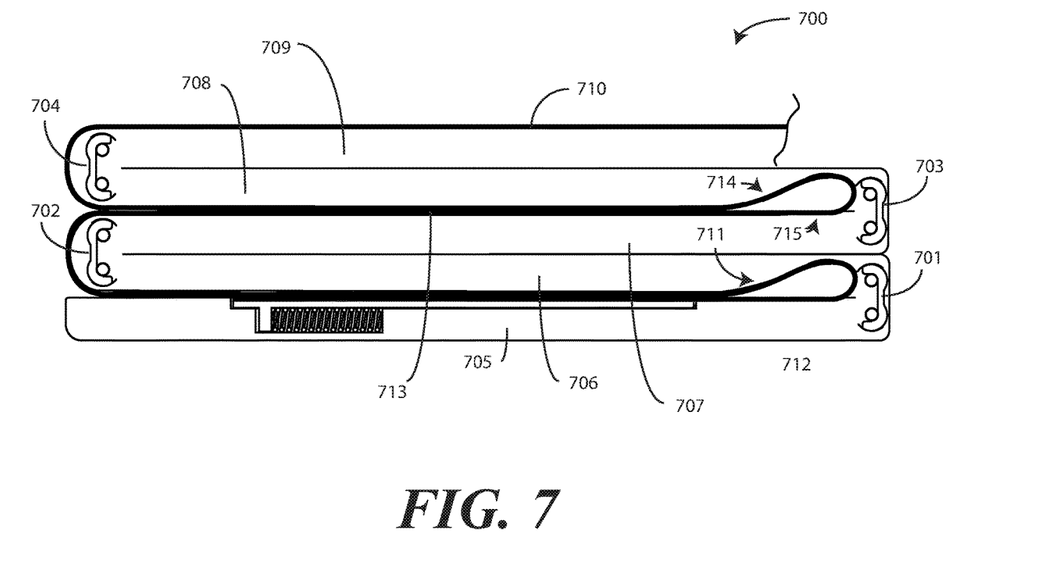
FIG. 7 illustrates another explanatory electronic device in accordance with one or more embodiments of the disclosure.

To this point, electronic devices configured in accordance with embodiments of the disclosure have only included a first device housing 102 and a second device housing 103. However, by adding additional hinges and additional device housings the concepts described herein, along with the use of asymmetrical service loops, can be extended to accommodate even larger flexible displays without becoming longer and wider in the folded position. Turning now to FIG. 7, illustrated therein is one embodiment of how this can occur.

As shown in FIG. 7, an electronic device 700 includes a plurality of hinges 701,702,703,704 and a plurality of device housings 705,706,707,708,709. While four hinges 701,702, 703,704 and five device housings 705,706,707,708,709, fewer than, or more than, the four hinges 701,702,703,704 and five device housings 705,706,707,708,709 could be used as well to create an electronic device that folds in an accordion fold.

As before, a first hinge 701 couples a first device housing 705 to a second device housing 706. A flexible display 710 spans the hinge 701. The second device housing 706 defines a curvilinear recess 711 that forms at least some of the flexible display 710 into an asymmetrical service loop 712 when the first device housing 705 and the second device housing 706 pivot about the hinge 701 from an axially displaced open position to the closed position shown in FIG. 7.

However, rather than the second device housing 706 terminating at an edge, it terminates instead at a second hinge 702. The second hinge 702 couples the second device housing 706 to a third device housing 707. While the flexible display 710 could pass through apertures in both the second device housing 706 and the third device housing 707, in this illustrative embodiment the flexible display 710 passes about an exterior of the second hinge 702 so that the flexible display 710 can transition into a planar surface when the first device housing 705 and the second device housing 706 pivot about the hinge 701 to an axially displaced open position from the closed position, and the second device housing 706 and the third device housing 707 pivot about the second hinge 702 to an axially displaced open position from the closed position. Accordingly, in this illustrative embodiment the flexible display 710 passes between the first device housing 705 and the second device housing 706, around the third hinge 703, and along an exterior 703 of the third device housing 707 when both the first hinge 701 and the second hinge 702 are in the closed position.

The electronic device 700 could include only the first device housing 705, the second device housing 706, and the third device housing 707, with the flexible display coupled to the third device housing 707 at an edge above the first hinge 701. However, the stack can repeat, with the number of device housings and hinges being determined by application. For example, in FIG. 7 a third hinge 703 couples the third device housing 707 to a fourth device housing 708. The flexible display 710 spans the interior of the third hinge 703.

The fourth device housing 708 defines another curvilinear recess 714 that forms at least some of the flexible display 710 into another asymmetrical service loop 715 when the third device housing 707 and the fourth device housing 708 pivot about the third hinge 703 from an axially displaced open position to the closed position shown in FIG. 7.

A fourth hinge 704 and a fifth device housing 709 can then be configured as are the second hinge 702 and the third device housing 707, and so forth. This process can repeat until the desired number of hinges and housings are in place to provide a flexible display having a desired length when all device housings are pivoted about their corresponding hinges to open displaced positions. The embodiment of FIG. 7 provides an accordion fold device that can accommodate flexible displays of essentially any length desired.

Figure 8:
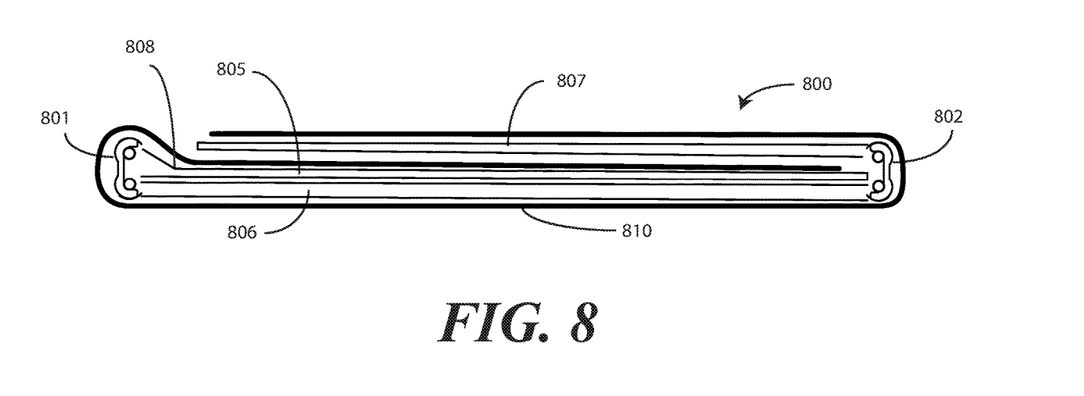
FIG. 8 illustrates another explanatory electronic device in accordance with one or more embodiments of the disclosure.

While displays in accordance with embodiments of the disclosure have generally spanned the interior of device housings to this point, embodiments of the disclosure contemplate that they could span the exterior as well. Turning now to FIG. 8, illustrated therein is one such embodiment.

As shown in FIG. 8, an electronic device 800 includes a plurality of hinges 801,802 and a plurality of device housings 805,806,807. As before, a first hinge 801 couples a first device housing 805 to a second device housing 806. A flexible display 810 extends across the first device housing 805 and spans the hinge 801 about an exterior of the electronic device 800.

However, rather than the second device housing 606 terminating at an edge, it terminates instead at a second hinge 802. The flexible display 810 extends across an exterior of the second device housing 806. The flexible display then and spans the second hinge 802 about the exterior of the electronic device 800, terminating at a location on the third device housing 807.

To facilitate the flexible display 810 extending flat when the electronic device 800 is unfolded, a third hinge could be included at location 808. This third hinge would rotate in the opposite direction to hinge 801, much in the same way a watchband made from coupled links can rotate. This would transition location 808 from an acute angle to flat. Sliding plates, as previously described, could then work to extend the flexible display 810 about the exterior of the electronic device 800. Additionally, a mechanical stop could be placed between the third device housing 807 and the first device housing 805 to prevent pinching.

Shown in the closed position in FIG. 8, the first device housing 805 is situated between the second device housing 806 and the third device housing 807. The first device housing 805 and the second device housing 806 are pivoted about the first hinge 801 from the axially displaced open position to the closed position. Similarly, the third device housing 807 and the second device housing 806 are pivoted about the second hinge 802 from the axially displaced open position to the closed position. This forms a trifold device, much like a wallet.

Figure 9:
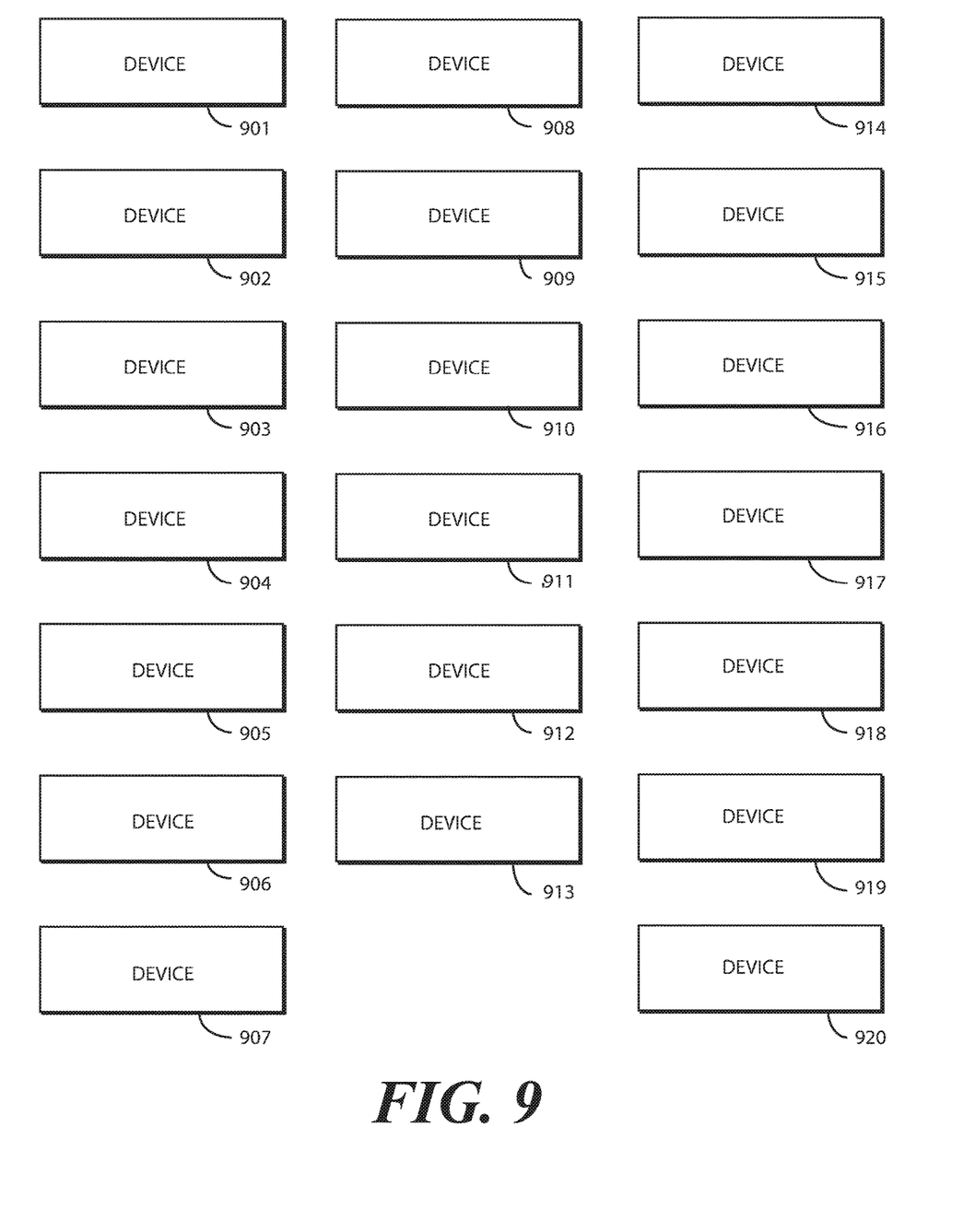
FIG. 9 illustrates various embodiments of the disclosure.

Turning now to FIG. 9, illustrated therein are various embodiments of the disclosure. At 901, an electronic device comprises a first device housing and a second device housing. At 901, the electronic device comprises a hinge coupling the first device housing to the second device housing. At 901, the first device housing is pivotable about the hinge relative to the second device housing. At 901, the electronic device comprises a flexible display coupled to the first device housing and the second device housing and spanning the hinge. At 901, one housing of the first device housing or the second device housing defines a curvilinear recess causing the flexible display to define a service loop, the service loop comprising a hemi-cardioid contour defining a convex lobe extending to a bifurcated distal cusp, when the first device housing and the second device housing pivot about the hinge from an axially displaced open position to a closed position.

At 902, the first portion of the hemi-cardioid contour of 901, which is disposed to a first side of an axis bisecting the bifurcated distal cusp, defines both a convex contour and a concave contour abutting the curvilinear recess. At 903, a first radius of the convex contour of 902 is less than a second radius of the concave contour.

At 904, another housing of the first device housing or the second device housing of 902 defines a linear recess into which the flexible display is positioned. At 905, a second portion of the hemi-cardioid contour of 904, disposed to a second side of the axis bisecting the bifurcated distal cusp, defines a linear portion extending distally from the convex lobe.

At 906, a radius of the convex lobe of 905 is between two and six millimeters, inclusive. At 907, the radius of the convex lobe of 906 is about five millimeters. At 908, the radius of the convex lobe of 806 is about three millimeters. At 909, a first radius of the convex contour of 908 is less than a second radius of the concave contour.

At 910, the service loop of 905 becomes planar when the first device housing and the second device housing pivot about the hinge to the axially displaced open position from the closed position. At 911, the electronic device of 910 further comprises one or more springs biasing the first device housing away from the second device housing when the first device housing and the second device housing pivot about the hinge to the axially displaced open position from the closed position.

At 912, one housing of the first device housing or the second device housing of 904 have a cross-sectional thickness that is greater than the another of the first device housing or the second device housing. At 913, the one housing of the first device housing or the second device housing of 912 define a recess into which the flexible display is positioned, wherein the curvilinear recess defines a boundary portion of the recess.

At 914, an electronic device comprises a hinge coupling a first device housing to a second device housing. At 914, the electronic device comprises a flexible display coupled to the first device housing and the second device housing and spanning the hinge. At 914, the first device housing defines a curvilinear recess forming at least some of the flexible display into an asymmetrical service loop when the first device housing and the second device housing pivot about the hinge from an axially displaced open position to a closed position.

At 915, the first device housing of 914 is thicker, in cross section, than the second device housing. At 916, the asymmetrical service loop of 914 comprises a hemi-cardioid contour comprising a convex lobe extending to a bifurcated distal cusp. At 917 a portion of the hemi-cardioid contour of 916 defines a convex contour and a concave contour. At 917, the concave contour has a radius greater than the convex contour.

At 918, the asymmetrical service loop of 917 of transforms to define a planar portion of the flexible display when the first device housing and the second device housing pivot about the hinge to the axially displaced open position from the closed position. At 919, the electronic device of 914 further comprises another hinge coupling a third device housing to one of the first device housing or the second device housing, wherein the flexible display passes between the first device housing and the second device housing, around the another hinge, and along an exterior of the third device housing when both the hinge and the second hinge are in the closed position. At 920 the electronic device of 914 further comprises another hinge coupling a third device housing to the second device housing, wherein the first device housing is situated between the second device housing and the third device housing when both the first device housing and the second device housing pivot about the hinge from the axially displaced open position to the closed position and the third device housing and the second device housing pivot about the another hinge from the axially displaced open position to the closed position.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. For example, while bending was the primary mode of changing a geometry of an electronic device, the multi-link hinges described herein could be used with other techniques, such as flexible housing portions, that allow squeezing, stretching, pulling, and shaking also to be used to change the geometry of an electronic device.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a first device housing and a second device housing;
   a hinge coupling the first device housing to the second device housing, the first device housing pivotable about the hinge relative to the second device housing;
   a flexible display coupled to the first device housing and the second device housing and spanning the hinge; and
   a flexible conductor positioned between the flexible display and the hinge;
   wherein one housing of the first device housing or the second device housing defines a curvilinear recess causing the flexible display to define an asymmetric service loop when the first device housing and the second device housing pivot about the hinge from an axially displaced open position to a closed position, the asymmetric service loop defining a convex lobe extending to a bifurcated distal cusp, with a first portion of the asymmetric service loop defining both a convex contour and a concave contour, where a first radius of the convex contour is less than a second radius of the concave contour.

2. The electronic device of claim 1, the first portion of the asymmetric service loop disposed to a first side of an axis bisecting the bifurcated distal cusp and abutting the curvilinear recess.

3. The electronic device of claim 2, further comprising one or more springs biasing the first device housing away from the second device housing when the first device housing and the second device housing pivot about the hinge to the axially displaced open position from the closed position.

4. The electronic device of claim 2, wherein another housing of the first device housing or the second device housing defines a linear recess into which the flexible display is positioned.

5. The electronic device of claim 4, wherein a second portion of the asymmetric service loop disposed to a second side of the axis bisecting the bifurcated distal cusp defines a linear portion extending distally from the convex lobe.

6. The electronic device of claim 1, wherein a radius of the convex lobe is between two and six millimeters, inclusive.

7. The electronic device of claim 1, the hinge comprising a first cam and a second cam, the flexible display positioned between the first cam and the second cam.

8. The electronic device of claim 1, wherein the asymmetric service loop becomes planar when the first device housing and the second device housing pivot about the hinge to the axially displaced open position from the closed position.

9. The electronic device of claim 1, the flexible conductor defining an electrically conductive pathway between the first device housing and the second device housing.

10. The electronic device of claim 1, the flexible conductor transferring one or more of power, digital signals, analog signals, or combinations thereof between electrical components disposed in the first device housing and other electrical components disposed in the second device housing.

11. The electronic device of claim 1, the one housing of the first device housing or the second device housing having a cross-sectional thickness that is greater than the another of the first device housing or the second device housing.

12. The electronic device of claim 1, the one housing of the first device housing or the second device housing defining a recess into which the flexible display is positioned, wherein the curvilinear recess defines a boundary portion of the recess.

13. An electronic device, comprising:
- a hinge coupling a first device housing to a second device housing;
- a flexible display coupled to the first device housing and the second device housing and spanning the hinge;
- a flexible conductor positioned between the flexible display and the hinge; and
- the first device housing defining a curvilinear recess forming at least some of the flexible display and at least some of the flexible conductor into an asymmetric service loop when the first device housing and the second device housing pivot about the hinge from an axially displaced open position to a closed position; and
- the flexible display flattening into an elongated position when the first device housing and the second device housing pivot about the hinge from the closed position to the axially displaced open position.

14. The electronic device of claim 13, further comprising one or more springs biased to flatten the flexible display into the elongated position when the first device housing and the second device housing pivot about the hinge from the closed position to the axially displaced open position.

15. The electronic device of claim 14, further comprising one or more other springs biasing the first device housing away from the second device housing when the first device housing and the second device housing pivot about the hinge to the axially displaced open position from the closed position.

16. The electronic device of claim 13, wherein the asymmetric service loop comprises a hemi-cardioid contour comprising a convex lobe extending to a bifurcated distal cusp, with a portion of the hemi-cardioid contour defining a convex contour and a concave contour, the concave contour having a radius greater than the convex contour.

17. The electronic device of claim 13, the asymmetric service loop transforming to define a planar portion of the flexible display when the first device housing and the second device housing pivot about the hinge to the axially displaced open position from the closed position.

18. The electronic device of claim 13, further comprising another hinge coupling a third device housing to one of the first device housing or the second device housing, wherein the flexible display passes between the first device housing and the second device housing, around the another hinge, and along an exterior of the third device housing when both the hinge and the another hinge are in the closed position.

19. The electronic device of claim 13, further comprising another hinge coupling a third device housing to the second device housing, wherein the first device housing is situated between the second device housing and the third device housing when both the first device housing and the second device housing pivot about the hinge from the axially displaced open position to the closed position and the third device housing and the second device housing pivot about the another hinge from the axially displaced open position to the closed position.

\* \* \* \* \*